United States Patent
Van Der Wiel (10) Patent No.: US 9,850,122 B2
(45) Date of Patent: Dec. 26, 2017

(54) METHOD FOR HERMETICALLY SEALING WITH REDUCED STRESS

(71) Applicant: MELEXIS TECHNOLOGIES NV, Tessenderlo (BE)

(72) Inventor: Appolonius Jacobus Van Der Wiel, Duisburg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 14/903,709

(22) PCT Filed: Jul. 9, 2014

(86) PCT No.: PCT/EP2014/064663
§ 371 (c)(1),
(2) Date: Jan. 8, 2016

(87) PCT Pub. No.: WO2015/004166
PCT Pub. Date: Jan. 15, 2015

(65) Prior Publication Data
US 2016/0159639 A1 Jun. 9, 2016

(30) Foreign Application Priority Data
Jul. 10, 2013 (GB) .................................. 1312405.2

(51) Int. Cl.
*B81B 7/00* (2006.01)
*B81C 1/00* (2006.01)

(52) U.S. Cl.
CPC .......... *B81B 7/0038* (2013.01); *B81B 7/0051* (2013.01); *B81C 1/00285* (2013.01); *B81C 2203/0145* (2013.01)

(58) Field of Classification Search
CPC ..................................................... H01L 23/564
See application file for complete search history.

(56) References Cited

U.S. PATENT DOCUMENTS 5,345,096 A * 9/1994 Gruning ................ H01L 23/051
257/150
5,760,526 A * 6/1998 Anderson ............ H03H 9/1085
310/313 R (Continued)

FOREIGN PATENT DOCUMENTS

DE 102011112476 A1 3/2013
EP 1908727 A1 4/2008

(Continued)

OTHER PUBLICATIONS

Great Britain Search Report for corresponding Great Britain Application No. 1312405.2, dated Jan. 9, 2014.

(Continued)

*Primary Examiner* — Eugene Lee
(74) *Attorney, Agent, or Firm* — Justin Cassell; Workman Nydegger (57) ABSTRACT

An electronic device comprising a first substrate having a device area, a first sealing element comprising an anelastic material and a second sealing element being a metal. The first sealing means and the second sealing means are arranged such that the inner side or the outer side of the sealing is completely formed by the second sealing element providing hermiticity and the other side is substantially formed by the first sealing element providing a flexible sealing.

19 Claims, 6 Drawing Sheets

(56) References Cited

U.S. PATENT DOCUMENTS

| | | | |
|---|---|---|---|
| 6,078,229 A * | 6/2000 | Funada | H03H 9/059 29/25.35 |
| 2004/0016995 A1 | 1/2004 | Kuo et al. | |
| 2007/0045820 A1* | 3/2007 | Rybnicek | H01L 21/76898 257/704 |
| 2007/0190747 A1* | 8/2007 | Humpston | B81C 1/00285 438/460 |
| 2012/0319303 A1 | 12/2012 | Foster et al. | |
| 2014/0226285 A1 | 8/2014 | Bauer et al. | |

FOREIGN PATENT DOCUMENTS

| | | |
|---|---|---|
| GB | 2421356 A | 6/2006 |
| WO | 2006061792 A2 | 6/2006 |
| WO | 2007017757 A2 | 2/2007 |

OTHER PUBLICATIONS

International Search Report for corresponding International PCT Application No. PCT/EP20141064663, dated Oct. 29, 2014.

* cited by examiner

METHOD FOR HERMETICALLY SEALING WITH REDUCED STRESS

FIELD OF THE INVENTION

The invention relates to the field of electronic devices, e.g. sensor devices. More particularly, the present invention relates to hermetically sealed devices, e.g. hermetically sealed sensors, and methods for hermetically sealing such devices, e.g. sensors.

BACKGROUND OF THE INVENTION

The expected product lifetime of an electronic device (usually expressed in a number of years) is directly related to functionality requirements of the device. The functionality of devices can be various: MEMS devices typically have moving mechanical components and often additional circuitry, IR sensors have components that are sensitive to infra-red light, etc. Furthermore, for a large number of electronic components protection from corrosion, water vapor, and oxidation is required. In order to protect electronic device, prolongue the lifetime of electronic devices, and—for some applications—also provide appropriate conditions for allowing functioning, electronic devices typically may be packaged.

Packaging of electronic devices thus often is an essential process step in the production. For a large number of applications, it is important that the electronic devices comprise a package that is hermetically sealing components. The permeability of a material typically is defined as the rate at which gas atoms diffuse through a material. Permeation rates can be compared for materials of equal thickness and under standardized atmospheres. For example, by definition materials with less than 1 day of sealing capacity ($10^{-14}$ gm/cm·s·Torr) are typically considered non-hermetic, a glass seal of 10 µm thick typically provides a seal lifetime of a few years, a metal seal of 10 µm thick typically provides a seal lifetime of a century or more.

Although considered "non-hermetic", organic seals, such as epoxy seals, are known to be adequate to keep out moisture (water molecules), regardless of the thickness of the seal ring. Such sealing may be sufficient for consumer products such as image sensors, microfluidic devices and others that primarily require prevention of moisture penetration of the seal.

In other applications, however, such as e.g. many automotive applications, hermeticity is a requirement, also against moisture. It is known to provide metal seals for MEMS packaging in e.g. automotive applications, wherein the seals have a seal geometry of 1 to 2 µm which could conceivably be reduced to less than 1 µm if mechanical integrity (strength) could be ensured.

Hermetic sealing using e.g. a metal sealing ring can be performed accurately. A disadvantage of a metal sealing ring is that it typically may be subject to mechanical stress, which may lead to cracking, loss of the hermetic sealing, and finally failure of the device.

Figure 1:
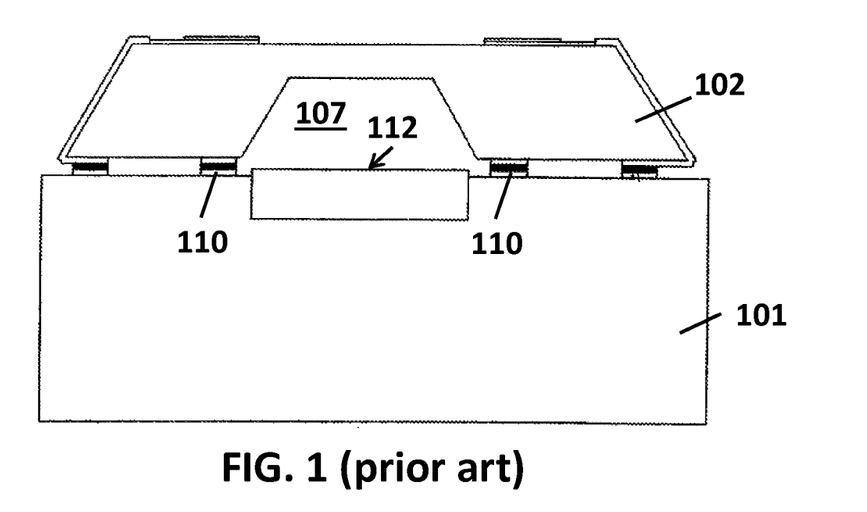
FIG. 1—prior art shows an example of a chip scale package for a micro component known in the art.

FIG. 1—prior art shows an example of a chip scale package for a micro component, as disclosed in WO2007/017757. The substrate 101 contains a sensor area 112, e.g. comprising a MEMS device. A cap structure 102 is attached to the sensor die by means of a seal ring 110 to hermetically encapsulate an area of the sensor die where the micro component is located, thus forming a hermetically sealed cavity 107. The seal ring may be a solder seal ring, which may be connected by thermo-compression bonding.

Figure 2:
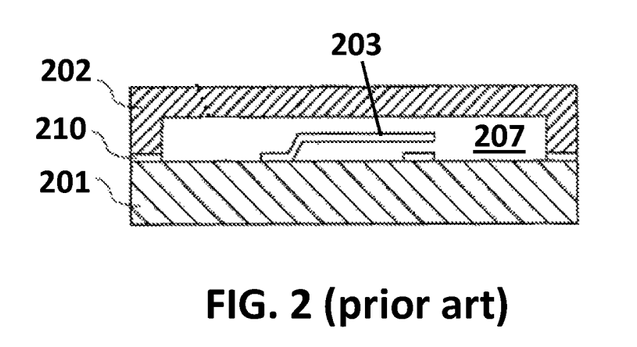
FIG. 2—prior art shows a microcap packaging known in the art.

FIG. 2—prior art shows a so called "microcap package", another specific type of packaging. A system is shown wherein the substrate 201 supports device 203, e.g. a MEMS device. A thick film or second substrate 202 is first aligned and then bonded to the first substrate 201 by means of a seal ring 210 to form a cap over device 201.

SUMMARY OF THE INVENTION

It is an object of embodiments of the present invention to provide a good method for sealing a semiconductor device, and a semiconductor device produced by that method.

It is an advantage of embodiments of the present invention to provide a method applicable at wafer level, for sealing a semiconductor device having a reduced resilient stress or having an improved crack resistance.

The above objective is accomplished by a method and device according to embodiments of the present invention.

The present invention relates to an electronic device comprising a first substrate having a device area, a first sealing means for sealing the device area, the sealing means having an inner side facing the device area and an outer side facing away from the device area, the sealing means comprising a first sealing element being positioned on the first substrate, the first sealing element forming a closed loop surrounding the device area and comprising an anelastic material, a second sealing element being a metal, the second sealing element being in contact with the first sealing element at each position along the closed loop, a second substrate positioned on the sealing means so as to sandwich the sealing means between the first and the second substrate for hermetically sealing the device area, wherein the first sealing element and the second sealing element are arranged such that the inner side or the outer side of the sealing means is completely formed by the second sealing element and the other side is substantially formed by the first sealing element.

It is an advantage of applying a sealing means as described above in that it combines both hermetic sealing with stress buffering. The latter is obtained by not making use of a single material, but combining a metal layer and an anelastic material in a specific way.

The second sealing element may be a metal film being partly deposited over the first sealing element. It is an advantage of embodiments of the present invention that stress concentration points in the metal film can be avoided. It is an advantage of embodiments of the present invention that the stress in the metal can be limited because the metal layer does not fully cover the anelastic material sealing element.

The inner side facing the device area may be formed by the second sealing element and the outer side facing away from the device area is formed by the first sealing element. It is an advantage of embodiments of the present invention that by using the two materials at different sides of the first sealing means, the materials can have a different coefficient of thermal expansion without this leading to cracking. It is an advantage of embodiments of the present invention that the metal can be used for obtaining hermetic sealing while the anelastic material allows to deal with thermal expansion of the sealing means.

The metal layer may have a thickness between 0.1 µm and 100 µm.

The metal layer may have a smooth cross-sectional profile without sharp edges. It is an advantage of embodiments of the present invention that a smooth cross-sectional profile without sharp edges is provided, e.g. using a Z-shape or an S-shape, because it offers an increased flexibility (as compared to a rigid block or box-shape profile), and in that by adapting its curvature or angle, it can change size at moderate stress.

The metal layer may comprise a first, a middle and a third portion, the portions being interconnected and the first portion being adhering to the first substrate, the middle portion being inclined with respect to the first substrate for allowing flexibility during temperature changes and the third portion being an upper portion substantially parallel with the substrate to facilitate further connection thereon. It is an advantage of embodiments of the present invention that the orientation of the third portion may render it more easy to provide a solder connection of the second substrate thereto.

The first portion of the metal layer may be positioned underneath the anelastic material, the middle portion may be positioned aside the anelastic material and the third portion may be positioned on top of the anelastic material. It is an advantage of embodiments of the present invention that the sealing means can be reduced in size by positioning part of the metal layer under the anelastic material. It is also an advantage that expansion of the anelastic material will cause stress inside the metal, but not in the metal-to-substrate interface, rendering the effect of stress less destructive.

The middle portion of the metal layer may have a sloped edge forming an angle with respect to the first substrate in the range of 20° to 70°, preferably in the range of 30° to 60°.

The anelastic material may selected from the group consisting of polyimides, silicones, acrylates, epoxys and fluoroelastomers.

It is an advantage of some embodiments of the present invention that anelastic materials can be used that are easily compatible with CMOS processing techniques.

The metal of metal layer may be selected from the group of copper and aluminum. It is an advantage of some embodiments of the present invention that metals can be used that are easily compatible with CMOS processing. In a particular embodiment, copper and polyimide is combined, whereby it is advantageous that the coefficient of thermal expansion of both materials is substantially equal.

The electronic device may further comprise a second sealing means having an inner side facing the outer side of the first sealing means and the second sealing means having an outer side facing away from the first sealing means, the second sealing means comprising a third sealing element positioned on the first substrate and comprising an anelastic material, a fourth sealing element being in contact with the third sealing and being a metal, wherein the third sealing element and the fourth sealing element are arranged such that the inner side or the outer side of the second sealing means is completely formed by the fourth sealing element and the other side is substantially formed by the third sealing element.

The first sealing means may comprise the second sealing element at the inner side and the second sealing means may comprise the fourth sealing element at the outer side. It is an advantage of using a metal coverage on the inside of the inner ring, to avoid out-gassing of the ring into the cavity and of using a metal coverage on the outside of the outer ring to avoid leakage of air or water vapour into the sealing means from the outside.

The device area may comprise an infra-red sensor device, and wherein the second substrate is transparent for IR radiation.

The device area may comprise a MEMS device.

The present invention also relates to a method for hermetically sealing a device area of a first substrate, the method comprising the steps of providing a first substrate having a device area to be hermetically sealed providing a first sealing means for sealing the device area, the sealing means having an inner side facing the device area and an outer side facing away from the device area, the sealing means comprising a first sealing element being positioned on the first substrate, the first sealing element forming a closed loop surrounding the device area and comprising an anelastic material and a second sealing element being a metal, the second sealing element being in contact with the first sealing element at each position along the closed loop, and the first sealing element and the second sealing element being arranged such that the inner side or the outer side of the sealing means is completely formed by the second sealing element and the other side is substantially formed by the first sealing element, providing a solder metal on top of the second sealing element, aligning a second substrate on top of the solder metal for hermetically sealing the area.

The anelastic material may be selected from the group consisting of polyimides, silicones, acrylates, epoxys and fluoroelastomers.

The metal may be selected from the group of copper and aluminum.

Providing a first sealing means may comprise providing a metal layer by providing a seed layer by vacuum deposition, and by electroplating the metal layer.

The method furthermore may comprise providing a second sealing means comprising a third sealing element positioned on the first substrate and comprising an anelastic material, and comprising a fourth sealing element being in contact with the third sealing and being a metal, wherein the third sealing element and the fourth sealing element are arranged such that the inner side or the outer side of the second sealing means is completely formed by the fourth sealing element and the other side is substantially formed by the third sealing element.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 6(a)-6(e) illustrates the steps of an embodiment of a method for sealing a device area 12 of a semiconductor device, according to aspects of the present invention.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Table 1 lists (approximate values of) some material properties for common substrates and thin film materials commonly used in the semiconductor industry.

TABLE 1

| Material | Tmelt (° C.) | mass density (g/cm³) | CTE (ppm/° C.) | E (Young's) (GPa) |
|---|---|---|---|---|
| Si | 1414 | 2.33 | 2.5-3.8 | 160 |
| Ge | 938 | 5.32 | 5.7-6.7 | 103 |
| GaAs | 1750 | 5.32 | 5.4-5.7 | 86 |
| GaP | 1510 | 4.13 | 5.3 | 103 |
| GaN | 1500 | 6.15 | 5.59 | 181 |
| InP | 1330 | 4.79 | 4.6 | 71 |
| Sapphire | 2040 | 3.98 | 8.4 | 345 |
| Quartz | | 2.20 | 0.6 | 72 |
| Cu | 1085 | 8.93 | 16.8-18.9 | 117 |
| Au | 1064 | 19.28 | 14.2 | 79 |
| Al | 660 | 2.70 | 23.2-28.3 | 70 |
| In | 157 | 7.29 | 35.0 | 11 |
| Sn | 232 | 7.29 | 25.0 | 50 |

In FIG. 1 and FIG. 2, illustrating packaging techniques applied in prior art, a sealing ring 110, 210 is used for hermetically sealing a cavity 107, 207 formed between a first substrate 101, 201 and a second substrate or lid or structure 102, 202. As indicated, if the sealing rings 110, 210 consists of an anelastic material (e.g. polyimide), the seal is not sufficiently hermitical to maintain a good vacuum or for harsh environments, such as e.g. automotive environments ("under the hood") or industrial processes (e.g. "the chemical industry"). If the sealing rings 110, 210 consist of a metal, e.g. copper, the devices are subjected to a severe resilient stress induced in the devices during the production. This is typically caused because the metal is bonded to the second substrate at elevated temperatures (e.g. at 220° C. or higher. When cooling down the device to room temperature, high resilient stresses remain between the metal and the substrates due to the different thermal expansion coefficients (CTE) of the metal and the substrate materials. This resilient stress may eventually lead to cracks, and ultimately to failure of the device.

As can be seen in Table 1, the CTE-values (coefficient of thermal expansion) of metals such as copper, gold, aluminum are substantially different from the CTE values of the substrate materials. Taking into account a temperature difference (temperature during bonding, versus room temperature) of about 630° C. for aluminum, about 1000° C. for gold and copper and 230° C. for Tin and typical solder materials, it is clear that resulting devices, and especially the sealing ring is subjected to severe stress, which may eventually crack, so that the hermetic seal is broken. Typically this stress is not constant over time, but changes as the temperature of the device changes, e.g. when in use, and when switched off. These so called "temperature cycles" may initiate or stimulate the growth of cracks.

In a first aspect the present invention relates to an electronic device which is hermetically sealed using packaging at wafer level. Embodiments of the present invention are especially useful for harsh environments such as e.g. automotive environments ("under the hood") or industrial processes (e.g. "the chemical industry") and for devices that need a vacuum below 1 mbar for proper functioning. According to embodiments, the electronic devices typically have a first substrate with a device area, whereby the device area is to be sealed. According to embodiments of the present invention, sealing means are used for such sealing. The sealing means typically has an inner side facing the device area and an outer side facing away from the device area. The sealing means according to embodiments of the present invention comprises a first sealing element being positioned on the first substrate, forming a closed loop surrounding the device area and comprising an anelastic material, e.g. organic material such as polyimide. The sealing means also comprises a second sealing element being a metal and being in contact with the first sealing element at each position along the closed loop. The first sealing element and the second sealing element thereby are arranged such that the inner side or the outer side of the sealing means is completely formed by the second sealing element and the other side is substantially formed by the first sealing element. The electronic device furthermore comprises a second substrate positioned on top of the sealing means so as to sandwich the sealing means between the first and the second substrate for hermetically sealing the device area. When joining the wafers together, typically an eutectic bond can be formed between each wafer and the sealing ring at the interface of contact when the metals dissolve into each other at the interface at a sufficiently high temperature. When the metals at both sides are different an alloy is formed as the atoms from both sides mix with each other in the liquid phase. The metal thicknesses at both wafers can be chosen in such a way that after the liquid state all material has formed a uniform eutectic alloy without volumes or grains with just one specific material. In this way an alloy can be formed at a relatively low temperature although the resulting alloy has a melting temperature well above the joining temperature. Typical examples can be the tin-gold bonding and the tin-nickel bonding. Particular features and advantages of embodiments of the present invention will further be discussed below, whereby standard and optional features will be described in more detail, embodiments of the present invention not being limited thereby or thereto.

Figure 3:
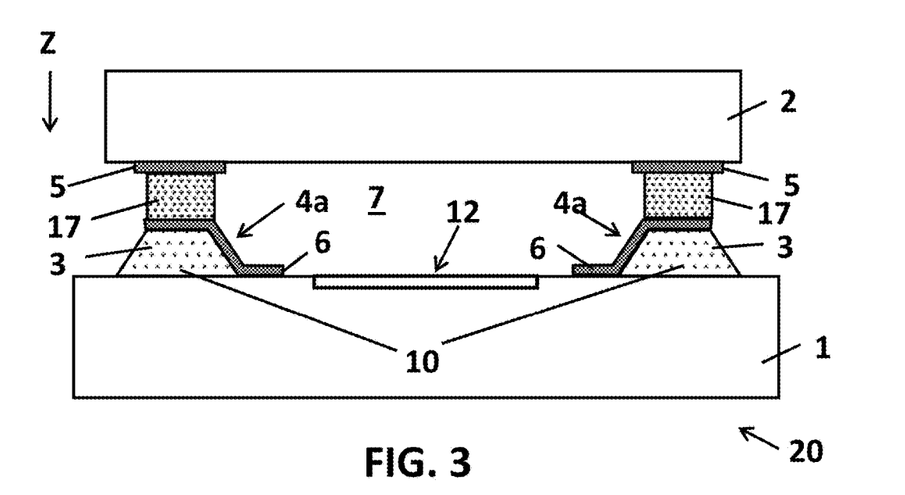
FIG. 3 shows an embodiment of a hermetically sealed device according to aspects of the present invention.

In one embodiment as shown in FIG. 3, an exemplary semiconductor device 20 is described. The device 20 comprises a first substrate 1, e.g. a silicon substrate, having an area 12 comprising devices such as e.g. sensors, transistors, MEMS devices, diodes, resistors, sensing membranes etc. The device 20 further comprises a sealing means comprising a first sealing element closed ring 10 (shown in cross section), comprising an anelastic material 3, e.g. organic materials such as polyimide or silicone. Although not visible in FIG. 3 being a cross section perpendicular to the substrate 1, the closed ring 10, when looking in a direction perpendicular to the substrate 1, can have any closed shape such as e.g. a circular shape, an ellipse, a polygon, a square, rectangle, or any other regular or irregular closed shape. Independent of the actual shape, the closed sealing element may be referred to as a ring in the present description.

In a cross-section of a plane perpendicular to the substrate 1 however, the sealing means of the device 20 shown in FIG. 3 advantageously has a smooth shape, e.g. a non-rectangular shape, with at least one sloped or curved edge 4a. In the example of FIG. 3, the sealing means has a substantially trapezoidal cross section with two sloped edges, an inner edge and an outer edge, but the trapezoidal shape is not essential, and other cross sectional shapes having upright edges with an inclination angle or slope with respect to the substrate 1, may be used as well. A second sealing element comprising metal, e.g. a metal layer 6, is partly covering the first sealing element 10. As shown, the metal layer 6 covers part of the substrate 1, the top of the trapezoidal shape, and one upright edge 4a (in the example of FIG. 3 the inner edge), not both edges. The metal layer 6 therefore has a Z-like shape (in cross section perpendicular to the substrate 1). On top of the metal 6, solder metal 17 is present, which is bonded to a second substrate 2, optionally through a further metal layer 5. Although indicated in different shadings, the metal layer 6, the solder material 17 and the optional additional metal layer 5 may combine to a single uniform alloy during bonding. Since the ring 10 is closed (when seen in direction Z), it forms a closed encapsulation around the cavity 7, more particularly around the device area 12. Because metal has a very low permeability (e.g. in the order of $10^{-14}$ gm/cm·s·Torr) the cavity 7 comprising the device area 12 can thus be hermetically sealed from the environment. The second substrate 2 in the exemplary electronic device of FIG. 3 is substantially planar, but in other embodiments, it may also have a cavity, e.g. similar to that shown in FIG. 1. The sealing structure of FIG. 3 has an improved crack resistance, as will be explained next.

Figure 4A:
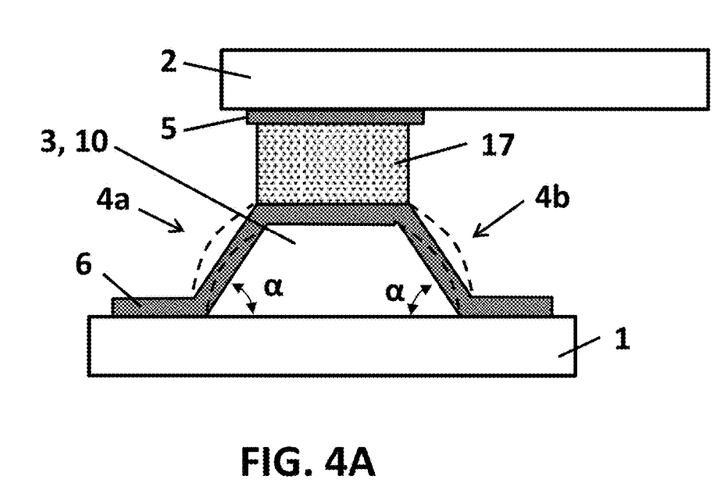
FIG. 4A illustrates an example of a seal ring structure with high resilient stress.

FIG. 4A shows the situation for which the organic sealing element 10 is completely covered by the metal 6. Despite the fact that both upright edges 4a, 4b of the ring 10 are inclined with an angle α of about 60°, experiments mimicking use of the device have shown that this structure easily cracks. A possible explanation might be that there is a difference in thermal expansion coefficient CTE of the anelastic material 3 and the metal 6. As the CTE of the metal 6 is lower than the CTE of the anelastic material 3, the anelastic material tends to shrink more than the metal (right after bonding), which may cause the anelastic material 3 to disconnect from the substrate 1 and/or from the metal 6, or both. Any forces exerted on the lid 2, would then need to be counteracted entirely by the metal 6, more particularly by the metal-substrate interface. These forces may be too high resulting in cracking of the sealing means.

Figure 4B:
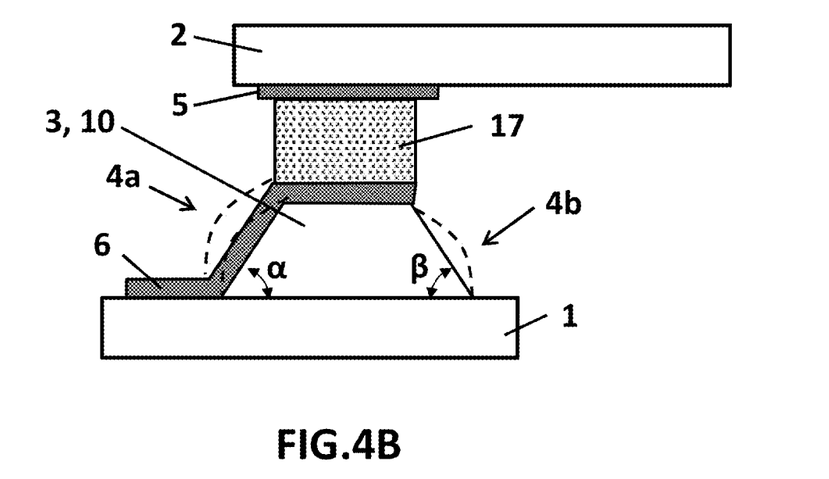
FIG. 4B illustrate an example of a seal ring structure according to an aspect of the present invention, having a reduced resilient stress.

FIG. 4B shows an embodiment where one upright side 4b of the anelastic ring structure 10 (the right side in FIG. 4B) is left uncovered with metal 6. This offers the advantage that the anelastic material 3 can expand or shrink differently than the metal 6. In addition, because a sloped edge is used as opposed to a straight angle, expansion or compression of the anelastic material 3 may be partly compensated by outwards or inwards bending (indicated in dotted lines). In other words, this structure is more flexible than the structure of FIG. 4A, and thus offers an improved crack resistance. Such as structure also allows variations in distance between the two silicon parts, especially when the material 3 shows anelastic behavior.

Suitable angles of α (i.e. the slope or inclination angle of the upright side 4a covered with metal) may be angles in the range of 30 to 90 degrees. The angle β (i.e. the slope or inclination angle of the upright side 4b not covered with metal) may be less critical.

Figure 5:
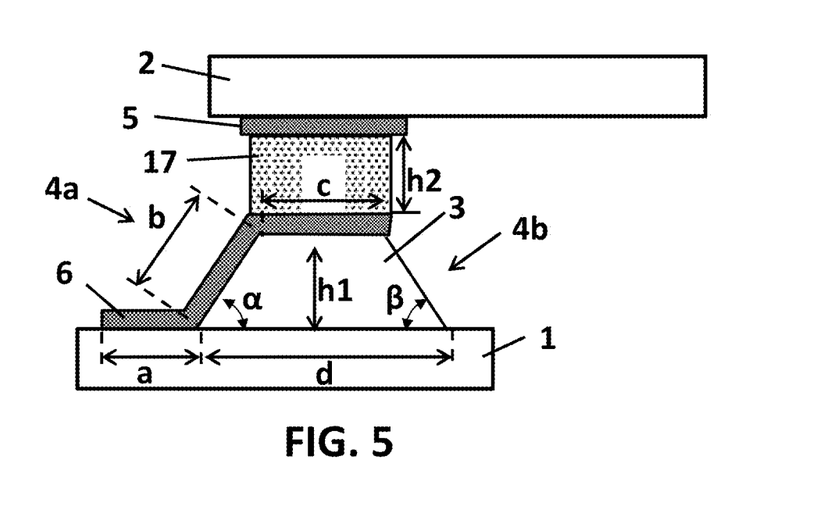
FIG. 5 illustrates some geometrical considerations of the seal ring of FIG. 4B.

FIG. 5 shows a specific example of the ring structure of FIG. 4B. In this particular embodiment, polyimide is used as the anelastic material 3 of the first sealing element, and copper is used as the metal of the second sealing element. The use of polyimide as the anelastic material 3 in combination with the metal layers 6, 17 and 5 is particularly advantageous, because polyimide is an anelastic material that can stretch a lot in all directions without losing its internal material structure. Therefore this material accommodates deformation without building up stress. Furthermore, as no plastic deformation takes place the material comes back to its initial shape when the initial circumstances in terms of humidity and temperature are again reached. In this example, the sealing ring 10 has a trapezoidal cross section.

Other typical combinations that may be used are polyimide combined with a metal adhesion layer such as TiW, nickel and a solder such as SnAg, SnAu, SnCu or other metal alloys especially suitable for eutectic bonding such as Al Ge, Al Si or Au Si.

It is also submitted that other smooth cross-sectional shapes can be used, and that the upright edges 4a, 4b need not be straight lines, but may be curved or rounded. The latter is even preferred, as it reduces stress concentrations. In some embodiments, the metal sealing element may for example be a metal film that is partly under the anelastic material sealing element, further covering one side of the anelastic material sealing element and also at least part of the top surface of the anelastic sealing element, the metal sealing element thus forming a C-shaped structure filled with the anelastic sealing element. The latter may result in a sealing means that requires less space. Furthermore expansion of the anelastic sealing element rather provides stress on the metal sealing element than on the connection between the metal sealing element and the substrate, where cracking can occur more easily.

In a second aspect, the present invention relates to a method for hermetically sealing an area of an electronic device.

According to embodiments of the present invention the method comprises providing a first substrate having a device area to be hermetically sealed. The method also comprises providing a first sealing means for sealing the inner device area wherein the sealing means has an inner side facing the device area and an outer side facing away from the device area. The sealing means comprises a first sealing element being positioned on the first substrate, having a closed loop form surrounding the device area and comprising an anelastic material; The sealing means also comprises a second sealing element being a metal, the second sealing element being in contact with the first sealing element at each position along the closed loop. According to embodiments of the present invention, the first sealing element and the second sealing element are arranged such that the inner side or the outer side of the sealing means is completely formed by the second sealing element and the other side is substantially formed by the first sealing element. The method also comprises providing a solder metal on top of the second sealing element and aligning a second substrate on top of the solder metal for hermetically sealing the area. By way of illustration, embodiments of the present invention not being limited thereto, an example of such a method will be described in more detail below, illustrating standard and optional features and advantages.

FIG. 6 illustrates a method for producing the device of FIG. 3, or in other words illustrates a method for hermetically sealing an area 12 of a semiconductor device 20. In a first step a first substrate 1, e.g. a CMOS wafer, is provided. The substrate 1 may contain one or more devices (not shown) such as for example transistors, diodes, resistors, etc, or it may contain e.g. one or more MEMS device, or other components or an array of components or sensing elements. The first substrate 1 is also referred to as "device substrate", in order to differentiate with the second substrate 2, which will be used to close the cavity, and may also be referred to as "the lid" or "cap substrate". The first substrate 1 may in one example comprise a passivation stack 14.

Figure 6A:
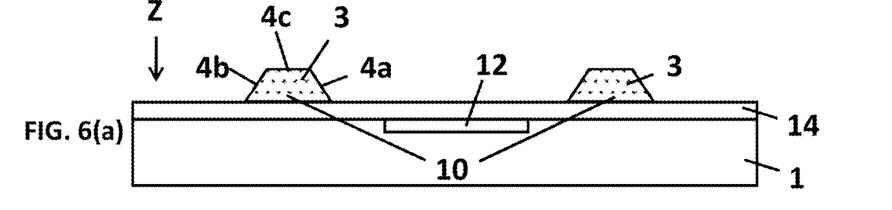
Figure 6B:
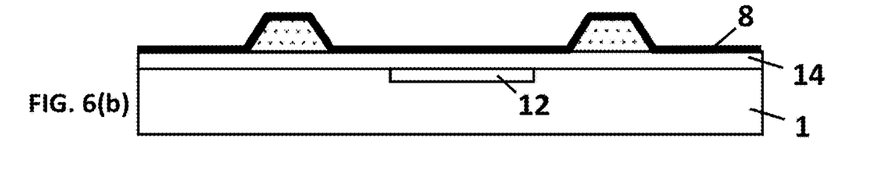
Figure 6C:
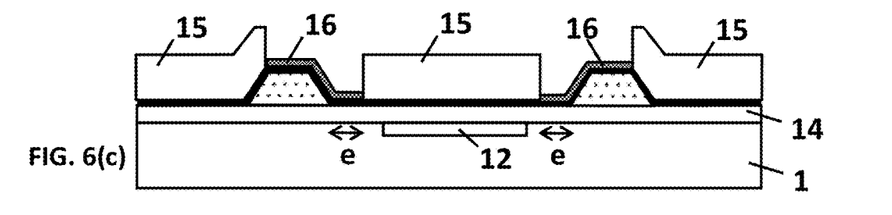
Figure 6D:
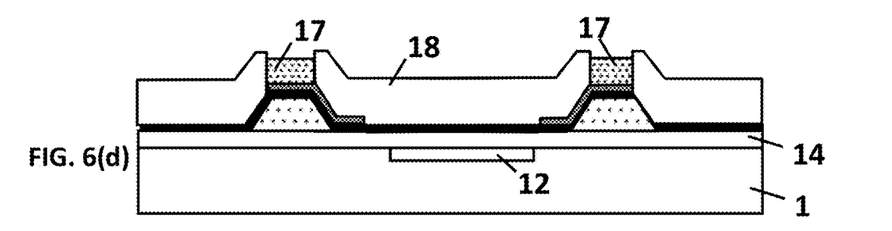
Figure 6E:
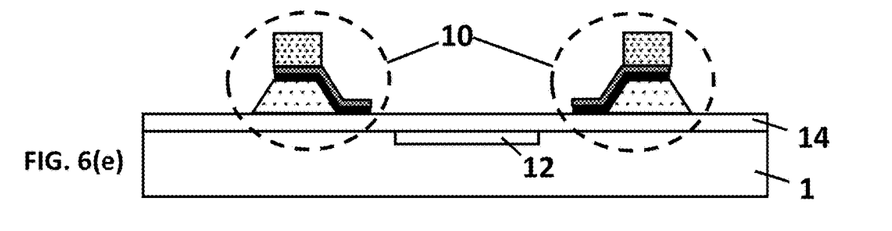

In a next step, the sealing means may be provided. The latter may be done by performing a number of substeps. In one example, first a first sealing element being a closed ring 10 of an anelastic material 3, e.g. polyimide or silicone, is deposited on top of the substrate 1. The first sealing element is surrounding the device area 12, and may be patterned, resulting in the structure shown in FIG. 6a. The patterning can be achieved by selective etching or dissolving The first sealing element 10 may have a smooth cross-section, e.g. a non-rectangular cross section in a plane perpendicular to the substrate 1. In one example, the cross-sectional shape may substantially be a trapezoidal shape with two upright edges 4a, 4b, and a top edge 4c which is substantially parallel to the first substrate 1. The particular smooth shape may be obtained by applying appropriate processing techniques such as gray tone illumination in combination with development techniques or simply reflow during curing.

Then a second sealing element is provided. In one example, the latter may be obtained by applying a plurality of sub-steps described further. In a first sub-step providing metal seed layer 8, e.g. a thin copper layer, being deposited over the substrate 1 and over the closed ring 10, e.g. by vacuum deposition, e.g. by sputtering. The result is shown in FIG. 6b. In a further sub-step a first resist mould 15 is applied to cover the substrate 1 except above the top edge 4c, and above the inner upright edge 4a of the closed ring 10, and above a portion of the substrate 1 directly adjacent the inner upright edge 4a, over a distance "e". Then a thin metal layer 16 is applied, e.g. using a thin plating technique, e.g. electroplating. Sputtering in combination with a lift off process is also possible. For thin layers even deposition and photolithography without a seedlayer can be used. The result is shown in FIG. 6c. In a further sub-step, a second resist mould 18 is applied to cover the substrate 1 except above the top edge 4c of the closed ring 10. and a metal 17 (referred to as solder metal) is deposited on top of the thin metal layer 16, e.g. by using a thick plating technique, e.g. electroplating. This layer 17 can consist of more than 1 kind of atoms in order to form an alloy during the bonding of the wafers. The result is shown in FIG. 6d. Then the first resist 15, and the second resist 18, and parts of the seed layer 8 not covered with metal, is removed by etching. The result is shown in FIG. 6e.

In a next step (not shown), the substrate 1 with sealing means is placed in a desired atmosphere, e.g. vacuum, and a second substrate 2 (not shown) is aligned with the first substrate 1, and then bonded thereto, e.g. by thermo-compression or melting, resulting in the hermetically sealed device 20 shown in FIG. 3. When the appropriate ratio of certain metal atoms is obtained it is possible to form during wafer joining an alloy with a higher melting temperature than the (eutectic) bonding temperature.

It should be noted that the he sealing structures 16 and 17 could also be realized by other ways of processing, e.g. by using selective etching by means of a patterned resist or with lift off techniques.

By way of illustration, embodiments of the present invention not being limited thereto, a number of other examples and embodiments will be further discussed, illustrating further features and advantages of embodiments of the present invention.

Figure 7:
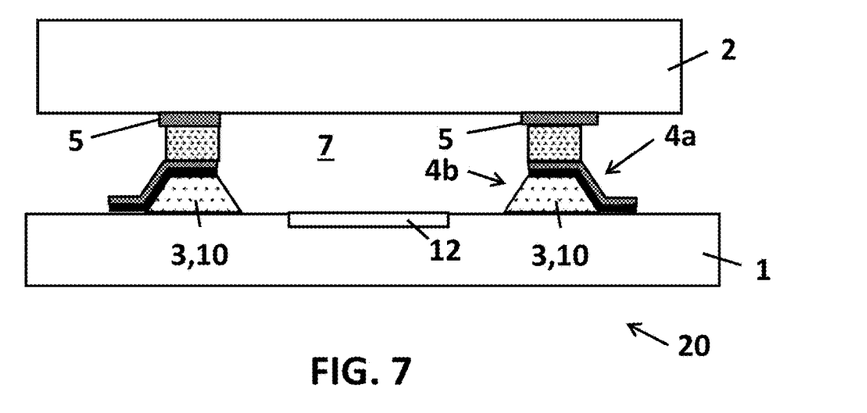
FIG. 7 shows a variant of the device of FIG. 4, according to aspects of the present invention.

FIG. 7 shows another embodiment of a device 20 according to aspects of the present invention. It is a variant of the device of FIG. 3. By comparing FIG. 3 and FIG. 7, it becomes clear that in FIG. 7 the outer upright edge 4a of the ring 10 is covered with metal, while the inner upright edge 4b is not covered with metal. The skilled person can easily modify the method shown in FIG. 6 to produce the device of FIG. 7, by applying the first resist 15 differently.

The device of FIG. 7 also has an improved crack resistance over the device of the prior art, because the anelastic material 3 has room to expand or compress differently than the metal. A difference between the sealing structure of the device shown in FIG. 3 and the sealing structure of the device shown in FIG. 7, is that in FIG. 3 the metal (forming the hermetic sealing) is on the inside of the ring 10, and the anelastic stress buffer is on the outside of the ring 10. This has the advantage that the anelastic material 3 cannot degas into the cavity 7. As a result the internal pressure will not increase due to degassing of the anelastic material. In FIG. 7 the metal (forming the hermetic sealing) is on the outside of the ring, and the anelastic stress buffer 3 is on the inside, thereby being protected from humidity, preventing it to "swell" e.g. due to water uptake, and thus preventing corrosion and cracking of the metal. The structure of FIG. 3 may be preferred over that of FIG. 7 in case vacuum quality inside the cavity 7 is more important than swelling of the anelastic material 3 due to humidity. The structure of FIG. 7 may be preferred over that of FIG. 3 in case humidity protection of the anelastic material 3 and corrosion of the metal is less important than out-gassing into the cavity 7.

Figure 8:
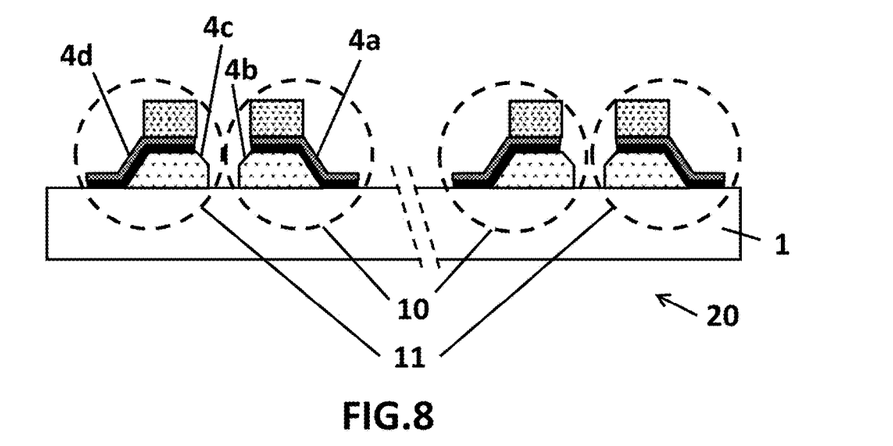
FIG. 8 shows an example of a device according to aspects of the present invention, having a double sealing ring.
Figure 9:
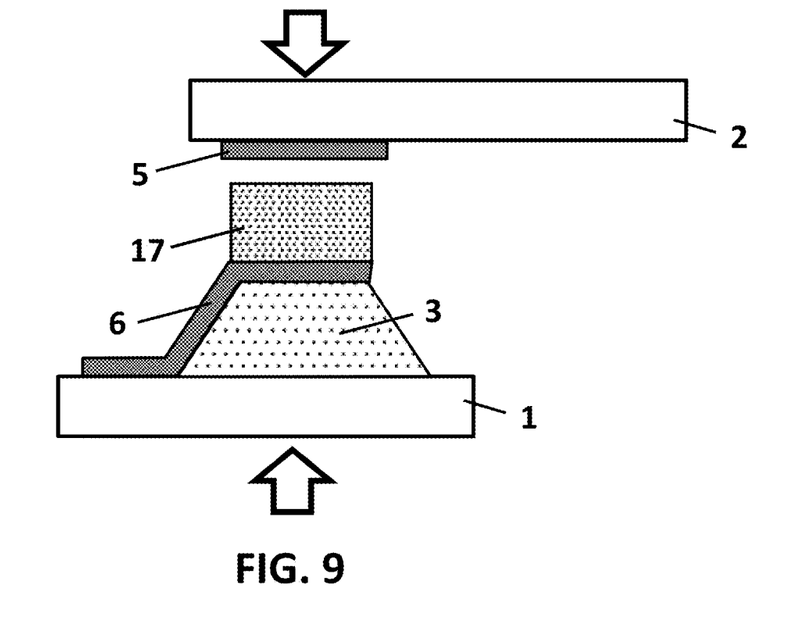
FIG. 9 shows providing a solder metal on top of the second sealing element.

FIG. 8 shows another embodiment of a semiconductor device 20 according to an aspect of the present invention. This device has two sealing means, one sealing means encircling the other sealing means. By using a double sealing means the risk for leakage into the cavity 7 (e.g. if the pressure inside the cavity is lower than that outside the cavity), or leakage outside the cavity (e.g. in case a specific atmosphere is present inside the cavity) is reduced.

In FIG. 8 the first, inner, sealing means is oriented with the metal edge 4a towards the inside, and the second, outer, sealing means is oriented with the metal side 4d towards the outside. This combines the advantages of no out-gassing of any atoms that may be present in the anelastic material 3 into the cavity 7, and at the same time preventing water uptake by the anelastic material 3, thus preventing swelling and corrosion.

In an alternative embodiment (not shown) of the device 20 with a double sealing means, the inner sealing means could be oriented with the metal directed towards the outside (away from the cavity), and the outer sealing means could be oriented with the metal directed towards the inside (towards the cavity). While such a structure hermetically seals the cavity, it may suffer from out-gassing into the cavity by the anelastic material of the inner sealing means, and from water uptake by the anelastic material of the outer sealing means.

It is an advantage of embodiments of the present invention that due to the higher flexibility of the sealing means, additional stress, e.g. introduced during manufacturing of the device can be better dealt with and the risk for cracking is reduced.

REFERENCES 1. first substrate, device substrate
2. second substrate, cap structure, lid structure
3. closed ring of anelastic material
4. upright edge
5. metal pattern on the second substrate
6. metal layer on top of the anelastic ring
7. cavity
8. (metal) seed layer
9. electroplated (metal) layer
10. first sealing ring
11. second sealing ring
12. device area (to be sealed)
14 passivation layer
15 first resist
16 thin (plated, sputtered or evaporated) metal layer
17 thick (plated, sputtered or evaporated) metal layer
18 second resist
20 semiconductor device
101 device substrate
102 cap structure
107 cavity
110. inner closed ring
111. outer closed ring
112. area to be sealed
201 device substrate
202 cap structure
203 device
207 cavity
210. closed ring
212. area to be sealed

The invention claimed is:
1. An electronic device comprising:
a first substrate having a device area,
a first sealing means for sealing the device area, the first sealing means having an inner side facing the device area and an outer side facing away from the device area, the first sealing means comprising
a first sealing element being positioned on the first substrate, the first sealing element forming a closed loop surrounding the device area and comprising an anelastic material,
a second sealing element being a metal, the second sealing element being in contact with the first sealing element along the closed loop,
a second substrate positioned on the first sealing means so as to sandwich the first sealing means between the first and the second substrate for hermetically sealing the device area,
wherein the first sealing element and the second sealing element are arranged such that one upright wall of the first sealing element is covered by the second sealing element such that the inner side or the outer side of the first sealing means is completely formed by the second sealing element and the other side is substantially formed by the first sealing element.
2. An electronic device according to claim 1, wherein the second sealing element is a metal film being partly deposited over the first sealing element.

3. An electronic device according to claim 1, wherein the inner side facing the device area is formed by the second sealing element being a metal, and the outer side facing away from the device area is formed by the first sealing element comprising an anelastic material.

4. An electronic device according to claim 2, wherein the metal layer has a smooth cross-sectional profile without sharp edges.

5. An electronic device according to claim 4, wherein the metal layer comprises a first, a middle and a third portion, the portions being interconnected and the first portion being adhering to the first substrate, the middle portion being inclined with respect to the first substrate for allowing flexibility during temperature changes and the third portion being an upper portion substantially parallel with the substrate to facilitate further connection thereon.

6. An electronic device according to claim 5, wherein the first portion of the metal layer is positioned underneath the anelastic material, the middle portion is positioned aside the anelastic material and the third portion is positioned on top of the anelastic material.

7. An electronic device according to claim 5, wherein the middle portion of the metal layer has a sloped edge forming an angle ($\alpha$) with respect to the first substrate in the range of 20° to 70°.

8. An electronic device according to claim 1, wherein the anelastic material is selected from the group consisting of polyimides, silicones, acrylates, epoxys and fluoroelastomers.

9. An electronic device according to claim 1, wherein the metal of metal layer is selected from the group of copper, tin, gold, aluminium and germanium.

10. An electronic device according to claim 1, the electronic device further comprising a second sealing means having an inner side facing the outer side of the first sealing means and the second sealing means having an outer side facing away from the first sealing means, the second sealing means comprising
  a third sealing element positioned on the first substrate and comprising an anelastic material,
  a fourth sealing element being in contact with the third sealing and being a metal, wherein the third sealing element and the fourth sealing element are arranged such that the inner side or the outer side of the second sealing means is completely formed by the fourth sealing element and the other side is substantially formed by the third sealing element.

11. An electronic device according to claim 10, wherein the first sealing means comprises the second sealing element at the inner side and wherein the second sealing means comprises the fourth sealing element at the outer side.

12. An electronic device according to claim 1, wherein the device area comprises an infra-red sensor device, and wherein the second substrate is transparent for IR radiation.

13. An electronic device according to claim 1, wherein the device area comprises a MEMS device.

14. A method for hermetically sealing a device area of a first substrate, the method comprising the steps of:
  a) providing a first substrate having a device area to be hermetically sealed;
  b) providing a first sealing means for sealing the device area, the first sealing means having an inner side facing the device area and an outer side facing away from the device area, the first sealing means comprising a first sealing element being positioned on the first substrate, the first sealing element forming a closed loop surrounding the device area and comprising an anelastic material and a second sealing element being a metal, the second sealing element being in contact with the first sealing element along the closed loop, and the first sealing element and the second sealing element being arranged such that one upright wall of the first sealing element is covered by the second sealing element such that the inner side or the outer side of the first sealing means is completely formed by the second sealing element and the other side is substantially formed by the first sealing element;
  c) providing a solder metal on top of the second sealing element;
  d) aligning a second substrate on top of the solder metal for hermetically sealing the area.

15. A method according to claim 14, wherein the anelastic material is selected from the group consisting of polyimides, silicones, acrylates, epoxies and fluoroelastomers.

16. A method according to claim 14, wherein the metal is selected from the group of copper, aluminum, gold, tin and germanium.

17. A method according to claim 14, wherein providing a first sealing means comprises providing a metal layer by providing a seed layer by vacuum deposition, and by electroplating the metal layer or by providing a metal layer by sputtering.

18. A method according to claim 14, wherein the method furthermore comprises providing a second sealing means comprising a third sealing element positioned on the first substrate and comprising an anelastic material, and comprising a fourth sealing element being in contact with the third sealing and being a metal, wherein the third sealing element and the fourth sealing element are arranged such that the inner side or the outer side of the second sealing means is completely formed by the fourth sealing element and the other side is substantially formed by the third sealing element.

19. An electronic device comprising:
  a first substrate having a device area,
  a first sealing means for sealing the device area, the first sealing means having an inner side facing the device area and an outer side facing away from the device area, the first sealing means comprising
  a first sealing element being positioned on the first substrate, the first sealing element forming a closed loop surrounding the device area and comprising an anelastic material,
  a second sealing element being a metal, the second sealing element being in contact with the first sealing element along the closed loop,
  a second substrate positioned on the first sealing means so as to sandwich the first sealing means between the first and the second substrate for hermetically sealing the device area with a eutectic bond between the each wafer and the second sealing element,
  wherein the first sealing element and the second sealing element are arranged such that one upright wall of the first sealing element is covered by the second sealing element such that the inner side or the outer side of the first sealing means is completely formed by the second sealing element and the other side is substantially formed by the first sealing element, and
  wherein the second sealing element has a smooth Z-shaped cross-sectional profile having a thickness between 0.1 and 100 µm.

* * * * *